US011486699B2

(12) United States Patent
Arnoult et al.

(10) Patent No.: US 11,486,699 B2
(45) Date of Patent: Nov. 1, 2022

(54) METHOD FOR MEASURING THE CURVATURE OF A REFLECTIVE SURFACE AND ASSOCIATED OPTICAL DEVICE

(71) Applicant: CENTRE NATIONAL DE LA RECHERCHE SCIENTIFIQUE (CNRS), Paris (FR)

(72) Inventors: Alexandre Arnoult, Auzeville-Tolosane (FR); Jonathan Colin, Colomiers (FR)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 16/615,661

(22) PCT Filed: May 23, 2018

(86) PCT No.: PCT/EP2018/063441
§ 371 (c)(1),
(2) Date: Nov. 21, 2019

(87) PCT Pub. No.: WO2018/215507
PCT Pub. Date: Nov. 29, 2018

(65) Prior Publication Data
US 2020/0158497 A1    May 21, 2020

(30) Foreign Application Priority Data
May 24, 2017   (FR) ...................................... 1754616

(51) Int. Cl.
*G01B 11/25*   (2006.01)
(52) U.S. Cl.
CPC .......... *G01B 11/25* (2013.01); *G01B 11/2522* (2013.01)

(58) Field of Classification Search
None
See application file for complete search history.

(56) References Cited

U.S. PATENT DOCUMENTS 5,912,738 A      6/1999  Chason et al.
6,051,844 A  *   4/2000  Au ........................ G01B 11/16
                                                          250/559.06

(Continued)

FOREIGN PATENT DOCUMENTS

FR      2 842 591 A1      1/2004
JP       63042413 A  *    2/1988

(Continued)

OTHER PUBLICATIONS

Chambard, et al., "3D displacement field measurement by digital image correlation—Metrological study and application to composite structure", Comptes Rendus des JNC 16, 2009.

*Primary Examiner* — Shadan E Haghani
(74) *Attorney, Agent, or Firm* — BakerHostetler

(57) ABSTRACT

A method for measuring the deformation of a reflective surface of an object is provided. The measuring device includes a lighting pattern containing spots of light, a camera and an image-analyzing device, the lighting pattern and the camera being arranged so that, in the measurement position, the virtual or real image of the lighting pattern is visible to the detector of the camera via the surface, the image being representative of the deformation of the lit region. The method comprises the following steps: measuring a distance between the images of two spots of light; computing the ratio between this measured distance and a reference distance; computing, from this ratio, the enlargement in a defined direction; computing the deformation of the reflective surface in the defined direction.

20 Claims, 9 Drawing Sheets

(56) References Cited

U.S. PATENT DOCUMENTS

| | | | |
|---|---|---|---|
| 6,858,859 B2* | 2/2005 | Kusunose | G01N 21/8901 250/559.45 |
| 8,976,250 B2* | 3/2015 | Armstrong-Muntner | G01M 11/005 348/180 |
| 9,070,590 B2 | 6/2015 | Camm et al. | |
| 9,138,790 B2 | 9/2015 | Isei et al. | |
| 9,404,739 B2* | 8/2016 | Nakatsukasa | G01B 11/24 |
| 9,975,364 B2* | 5/2018 | Vicente Vicente | H04N 1/3872 |
| 2004/0207836 A1* | 10/2004 | Chhibber | G01N 21/9501 356/237.4 |
| 2007/0146685 A1 | 6/2007 | Yoo et al. | |
| 2009/0190139 A1 | 7/2009 | Fisher et al. | |
| 2012/0002038 A1* | 1/2012 | Furrer | A45D 31/00 348/129 |
| 2012/0002213 A1 | 1/2012 | Kannaka et al. | |
| 2013/0061666 A1* | 3/2013 | Gillies | G01B 11/16 73/117.03 |

FOREIGN PATENT DOCUMENTS

| | | | |
|---|---|---|---|
| JP | 02184707 A | * | 7/1990 |
| WO | 2015/135952 A1 | | 9/2015 |
| WO | 2016/018260 A1 | | 2/2016 |

* cited by examiner

METHOD FOR MEASURING THE CURVATURE OF A REFLECTIVE SURFACE AND ASSOCIATED OPTICAL DEVICE

CROSS-REFERENCE TO RELATED APPLICATIONS

This application is a National Stage of International patent application PCT/EP2018/063441, filed on May 23, 2018, which claims priority to foreign French patent application No. FR 1754616, filed on May 24, 2017, the disclosures of which are incorporated by reference in their entirety.

FIELD OF THE INVENTION

The field of the invention is that of optical devices for measuring deformations of reflective surfaces. These measuring devices may in particular be used to measure the deformation of semiconductor wafers. The measuring device according to the invention allows the wafer to be inspected during operations for depositing layers of material necessary for the production of electronic components. The measuring device also allows said wafers to be inspected after deposition or any type of material processing leading to a deformation of the wafer to be monitored or inspected ex situ.

BACKGROUND

When vacuum-deposition operations are carried out to deposit layers of material on a semiconductor wafer, for example by molecular beam epitaxy, stresses develop in the deposited layer and induce mechanical stresses in the wafer. Generally, wafers have quite small thicknesses, typically varying between 100 microns and 700 microns. Under the effect of the experienced stresses, they may deform to a greater or lesser extent. Knowledge of these deformations therefore gives information on the scale, nature and location of the stresses, making it possible to determine whether the deposition under way is proceeding correctly or not and to determine the atomistic mechanisms causing these stresses.

Wafers are generally reflective. To measure deformations, this property is used and the measuring devices used are optical devices. All these devices comprise a light source of known geometry and a receiver. The light source and the receiver are arranged so that the light emitted by the source is observable by the receiver via the reflective surface. The receiver therefore sees the image of the source via the surface of the wafer. If the wafer is a perfect planar mirror, this image is not deformed, to within the uncertainties of the measuring system. If the wafer is deformed under the action of a stress, the image of the source is deformed. The measurement of this deformation allows the deformation of the reflective wafer to be determined.

Generally, the sources used are of simple geometric shape or consist of spots of light arranged in a known geometry. The spots of light may be generated, for example, using a laser beam reflected a plurality of times inside a plate with planar and parallel faces. The plurality of transmitted parallel beams forms the lighting pattern. U.S. Pat. No. 5,912,738 entitled "Measurement of the curvature of a surface using parallel light beams" describes such a measuring device. U.S. Pat. No. 9,070,590 entitled "Workpiece breakage prevention method and apparatus" describes another type of measuring device for an application different from that of measurement of the characteristics of wafers, the device measuring thermal stresses.

One of the constraints on this type of measuring device is that the deposition is carried out inside a vacuum reactor into which it is, of course, impossible to introduce optical elements. In this case, the light is necessarily emitted and received outside of the reactor, through transparent portholes. However, the wafer may be of large size. Thus there are wafers the diameter of which is 250 millimeters. To inspect a wafer of this size, the light source and receiver could be moved to carry out various measurements but it will be understood how difficult it would be to then preserve the precision and quality of the measurement, in light of the fact that the inspection must be carried out in real time so as to be able to take action if the deposition operations are not proceeding as they should be. In addition, in most cases, such movements with the aim of shifting the light source are difficult or impossible to achieve because of the small size of the portholes.

SUMMARY OF THE INVENTION

The measuring method according to the invention and the associated measuring device do not have these drawbacks. They are based on the fact that it is possible to move the lit region of the reflective surface, even when the reflective surface is large in size, without moving the receiver. More precisely, a first subject of the invention is a method for measuring the deformation of at least one reflective surface of an object using a measuring device, said measuring device comprising at least one lighting pattern containing spots of light, a camera and an image-analyzing device, the lighting pattern and the camera being arranged so that, in the position of measurement of the deformation of said surface, the virtual or real image of the lighting pattern is visible to the detector of the camera via the surface, said image being representative of the deformation of the region of the surface lit by the lighting pattern, characterized in that the method for carrying out a measurement comprises the following steps:

Step 1: measuring at least one distance between the images of two spots of light;

Step 2: computing the ratio between this measured distance and at least one reference distance;

Step 3: computing, from this ratio, the enlargement in a defined direction;

Step 4: computing the deformation of the reflective surface in said defined direction.

Advantageously, the method comprises a fifth step in which steps 1 to 4 are carried out for a plurality of images of spots of light so as to measure the enlargement in a plurality of given directions and to compute the anisotropy of the deformation of the reflective surface.

Advantageously, the lighting pattern contains a set of discrete spots of light distributed in a matrix array.

Advantageously, the lighting pattern contains at least one circle or one ellipse of light, the measurement being carried out on the images of spots belonging to this circle or to this ellipse of light.

Advantageously, the method comprises a step of carrying out at least one second measurement, the second measurement comprising emitting a second lighting pattern, said means for carrying out the two measurements being arranged so that the first lighting pattern associated with the first measurement lights a first region of the surface different from the second region of the surface lit by the second lighting pattern associated with the second measurement, the camera remaining stationary between the two measurements.

A second subject of the invention is a device for measuring the deformation of a least one reflective surface of an object, said measuring device comprising at least one lighting pattern containing spots of light, a camera and an image-analyzing device, the lighting pattern and the camera being arranged so that, in the position of measurement of the deformation of said surface, the virtual or real image of the lighting pattern is visible to the detector of the camera via the surface, said image being representative of the deformation of the region of the surface lit by the lighting pattern, characterized in that the image-analyzing device comprises:

means for measuring at least one distance between the images of two spots of light;
first computing means for computing the ratio between this measured distance and at least one reference distance;
second computing means for computing, from this ratio, the enlargement in a defined direction;
third computing means for computing the deformation of the reflective surface in said defined direction.

Advantageously, the device comprises means for carrying out at least two measurements, each measurement comprising emitting a lighting pattern, said means for carrying out the two measurements being arranged so that the first lighting pattern associated with the first measurement lights a first region of the surface different from the second region of the surface lit by the second lighting pattern associated with the second measurement, the camera remaining stationary between the two measurements.

Advantageously, the measuring device comprises means for moving, deforming or magnifying the lighting pattern.

Advantageously, the means for carrying out the measurements comprise means for moving the object in a defined plane between the two measurements and means for measuring said movement.

Advantageously, the means for moving the object in said plane are rotating or translating means.

Advantageously, the measuring device comprises a display screen and graphical means for generating said lighting pattern on said display screen.

Advantageously, the lighting pattern is a matrix array of discrete spots of light.

Advantageously, the lighting pattern is a circle of light or an ellipse of light or a series of circles of light or ellipses of light.

Advantageously, the measuring device comprises a lighting source that lights an opaque screen containing apertures arranged so as to form a lighting pattern.

Advantageously, the measuring device comprises a half-silvered planar beam splitter arranged so that the image of the pattern of spots, after transmission by said beam splitter, reflection from the surface and reflection from said beam splitter forms on the detector of the camera or after reflection from said beam splitter, reflection from the surface and transmission by said beam splitter forms on the detector of the camera.

Advantageously, the measuring device comprises means for carrying out a plurality of measurements to produce a complete map of the deformation of said surface.

Advantageously, the local, concave or convex, radius of curvature of the deformations varies between a few millimeters and a few tens of kilometers.

Advantageously, the object is a semiconductor wafer, the reflective surface being one of the sides of said wafer.

The invention also relates to the use of a measuring device such as defined above to measure a concave reflective surface, characterized in that the lighting pattern and the camera are arranged so that the image of the lighting pattern reflected by the concave reflective surface is located in the vicinity of the lens of the camera.

Advantageously, the device is used to monitor a process leading to a deformation of the reflective surface of an object in a growth reactor, characterized in that the measurements are carried out during the deposition of at least one layer of material on said reflective surface.

Advantageously, the device is used to inspect semiconductor wafers, characterized in that the measurements are carried out continuously on at least two different objects.

BRIEF DESCRIPTION OF THE DRAWINGS

The invention will be better understood and other advantages will become apparent on reading the following description, which is given nonlimitingly, and by virtue of the appended figures, in which.

DETAILED DESCRIPTION

As has been said, the measuring device may be used to measure the deformations of a reflective surface of an object. It is particularly well suited to measuring deformation of semiconductor wafers. The following examples all relate to this technical field, though this should not be considered to mean that the invention is restricted thereto.

Figure 1:
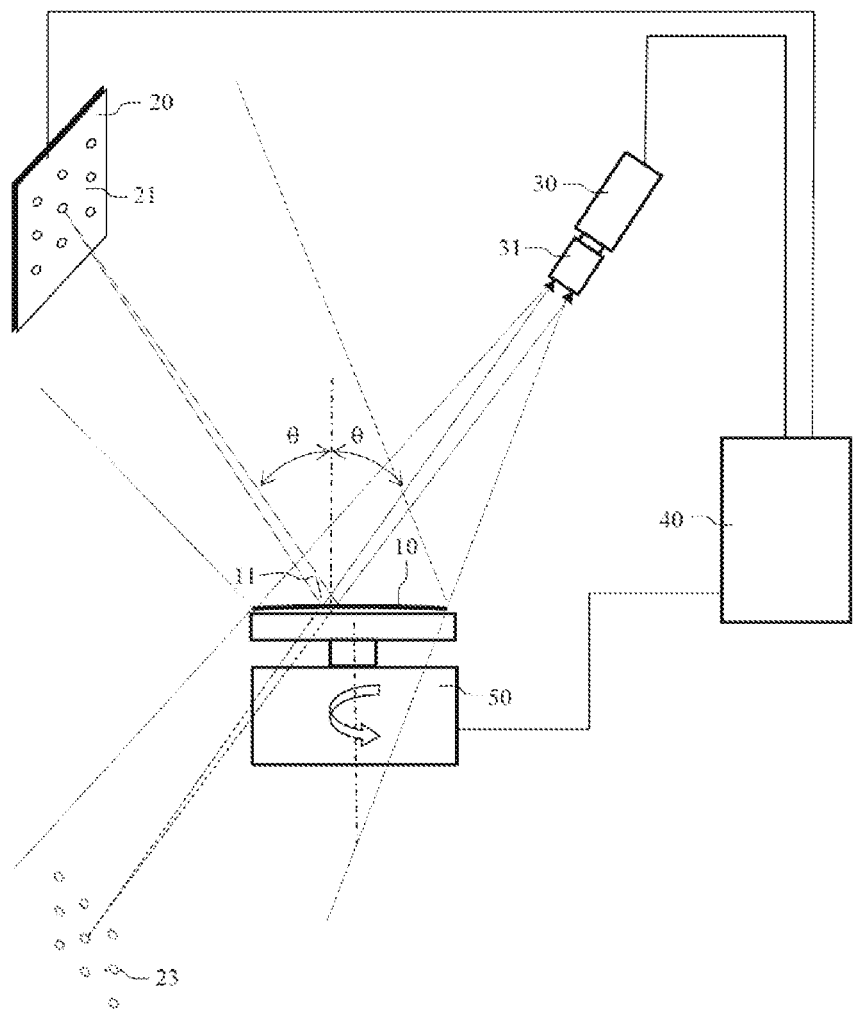
FIG. 1 shows a first embodiment of the measuring device according to the invention, the device comprising a turntable.

By way of a first nonlimiting example, FIG. 1 shows a first embodiment of the device according to the invention for measuring deformations of a wafer 10. In this and the following figures, the wafer is represented by a thick circular arc so as to illustrate the deformations. Furthermore, the path of the light rays output from a particular spot of the lighting pattern has been indicated with fine dashed lines and the field covered by the objective of the camera has been indicated by large dashed lines.

Generally, wafers have a thickness comprised between 100 microns and 700 microns. Their diameter is generally comprised between 25 millimeters and 250 millimeters. The measuring device is able to measure, if suitable changes are made to its configuration, deformations the local, concave or convex, radius of curvature varies between a few millimeters and a few tens of kilometers. These substrates are, for example, made of gallium arsenide.

The measuring device comprises means 20 allowing a lighting pattern 21 of known form to be created. It is possible to produce this pattern using discrete components such as lighting sources that light transparent symbols pierced in an opaque screen. It is also possible to use display screens on which the lighting pattern is displayed. In this case, it becomes easy to modify the lighting pattern or to duplicate it or to move it over the display screen or even to modify its brightness or its color.

It may be advantageous, to limit parasitic light, to use monochromatic or spectrally limited radiation. In this case, the photosensitive receiver is equipped with a spectral filter that solely transmits the emitted radiation.

Figure 3:
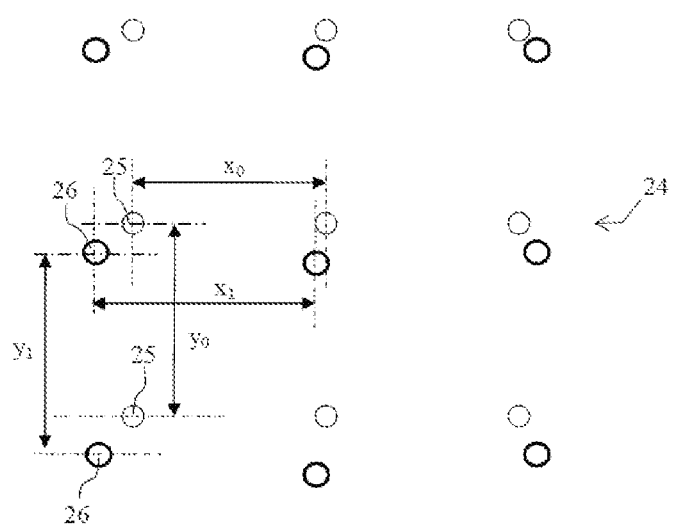

The geometric lighting pattern is generally formed by spots of light that may be structured in the form of a matrix array. By way of example, FIG. 3 shows an array of this type comprising nine spots of light 22 arranged in a matrix array comprising three columns and three rows. In FIG. 3, the spots of light have been represented by disks. The use of spots of light facilitates processing of the signal, as will be seen. It is possible to use, to obtain higher precision, matrix arrays containing more spots. Increasing the number of spots of light increases the precision of the measurements but increases correspondingly the processing time of the images. However, in certain applications, it is advantageous to work in real time with a limited number of spots of light.

By way of example, the diameter of the spots of light is about 500 microns and the distance between two spots about a few millimeters.

When the measuring device is used with a vacuum chamber, the lighting pattern is outside of the chamber. The distance separating the lighting pattern from the wafer is about a few tens of centimeters. The measuring device may work with various angles of inclination θ between a straight line joining the center of the lighting pattern and the center of the lit region and the normal to the surface of the wafer. However, if it is desired to make the measuring device work at normal or almost normal incidence, it is necessary to modify it as will be seen in the rest of the description so as to separate the emission channel from the reception channel.

One of the advantages of the device according to the invention is that it is able to work whatever the angle of inclination. It is important to note that the sensitivity of the device increases with the angle of inclination θ. It varies, to a first approximation, with the inverse of the cosine of the angle of inclination in the case of low curvature and is therefore maximum at grazing incidence. It is therefore advantageous to use large angles of inclination. The only limit is that, as the angle of inclination increases, the projection of the lighting pattern on the reflective surface covers an increasingly large area of reflective surface. Typically, in order to benefit from this advantage, the angle of inclination may be in an angular range comprised between 60 degrees and 89 degrees.

The wafer forms, by reflection, an image 23 of the lighting pattern 21, which image has been drawn with dashed lines in FIG. 1 and the following figures.

The measuring device also comprises a photosensitive receiver 30. It is a question of a camera. It comprises an objective 31 the focal length which is a few centimeters and a matrix array of photo receivers (which is not shown in the various figures). It is possible to use, for example, an objective the focal length of which is 50 millimeters or 100 millimeters. The aperture of this objective conventionally defines the depth of field. It is not necessary for the matrix array of photo receivers to have a high resolution. As may be seen in FIG. 1, the optical axis of the camera is arranged so that the final image 24 of the image 23 of the lighting pattern reflected by the wafer is located substantially in the center of the field of the camera. The camera therefore occupies a position that is symmetric with that of the lighting pattern, with respect to the normal to the surface of the wafer. The field of view of the camera equipped with its objective must allow the entirety of the image of the pattern to be seen. As has been said, the optic of the camera may comprise a spectral filter suitable for the emission spectral band of the lighting pattern, so as to decrease parasitic light.

Figure 2:
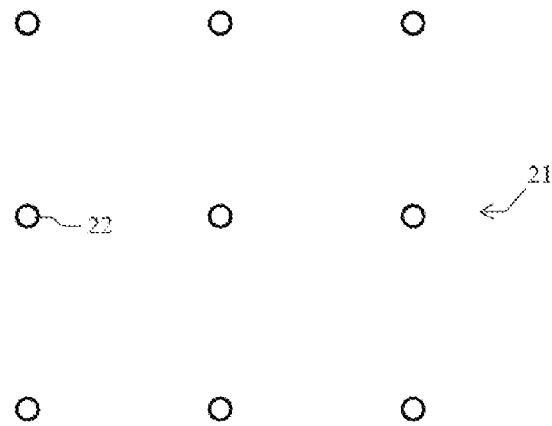
FIGS. 2 and 3 illustrate the principle of the optical measurement of deformations of the wafer.

For a lighting pattern 21 such as shown in FIG. 2 and comprising nine spots of light 22, an image 24, shown in FIG. 3, comprising nine spots of light 22 is obtained, in the end, after reflection from the wafer and focus by the objective 31. It comprises nine spots of light represented by disks 26.

If the wafer were perfectly planar, this image 24 would consist of the disks 25 drawn with dashed lines. It would be the perfect image of the lighting pattern.

If the wafer is deformed, this image is deformed and it consists of the disks 26 drawn with thick lines. It is possible, by analyzing the image using image-analyzing means 40 to determine, with a high precision, higher than that of the photodetection matrix array, the positions of the centers of each image 26 of each spot of light 22.

It is possible use, to this end, so-called "upscaling" techniques that allow the resolution of the image to be artificially increased. Typically, the scale factor of the upscaling is eight for this type of application.

Therefore, it is possible to determine, in a two-dimensional coordinate system (X, Y), as may be seen in FIG. 3, very precisely the distances $x_1$ in X and $y_1$ in Y between the spots of light 26 at a time t1 and compare them to the distances $x_0$ and $y_0$ obtained between the spots of light 25 at a time t0 on a reference surface. The ratios between the averages of these distances allow the enlargements in defined directions to be accessed. The principles of geometric optics allow the deformations to be deduced from the measurement of these enlargements. Using the same optical principles, the study of the enlargements in a plurality of directions allows the anisotropy of the deformation to be deduced. By adding the property of invariance of the brightness with angle of incidence, it is possible to apply these principles whatever the angle between the lighting pattern and the normal to the surface of the wafer.

The image processing requires computational computing means that both in terms of computational resources and in terms of the memory required are completely compatible with the performance achievable with current desktop computers and may be carried out in real-time, i.e. in the time interval separating two measurements, i.e. a few hundredths of a second.

The measured deformations are those of the region 11 of the wafer lit by the lighting pattern. If the wafer has large dimensions, this zone only partially covers the wafer 10. Thus, the measuring device according to the invention comprises means for carrying out a least two measurements, each measurement comprising emitting a lighting pattern, said means for carrying out the two measurements being arranged so that the first lighting pattern associated with the first measurement lights a first region of the wafer different from the second region of the wafer lit by the second lighting pattern associated with the second measurement, the camera remaining stationary between the two measurements. One alternative is to map curvature using an array of fixed spots covering all the screen and the image of which covers the entire area of the studied surface.

In the present case, the measuring device comprises a turntable 50 placed under the wafer 10. The axis of rotation of this turntable is parallel to the normal to the surface of the wafer. The advantage of this arrangement is that, for reasons of uniformity of the deposited layers, most vacuum chambers comprise this type of turntable. Thus, to produce a complete map of the wafer, it is enough to record a series of measurements corresponding to various angles of rotation of the wafer. If the deformation of the wafer is uniform and isotropic, the measuring device allows the deformation to be measured continuously with a sensitivity identical to that obtained with a stationary wafer, despite the rotation.

Under the typical conditions of deposition of thin atomic films on the wafer, to preserve sensitivity at the scale of a monolayer while nonetheless employing the measurement to optimize the signal-to-noise ratio, the camera must have an acquisition frequency of at least 10 Hz.

It is necessary to know with precision the position of the wafer at the time of the measurement. Various techniques may be used to determine this position. One possible technique consists in calibrating the wafer before deposition. This calibration has the advantage of allowing all of the defects of the system to be recorded. Thus, during the measurements, the measured deviations correspond solely to the deformations induced by the deposition on the wafer.

By way of example, if the turntable turns at a speed of 12 revolutions/mn and if the camera carries out measurements at a rate of 30 recordings per second, a series of recordings corresponding to regions separated by degrees is thus obtained. Since these regions are angularly close, it is then possible, by interpolation between two successive angles, to reference the curvature at any angle of rotation of the turntable perfectly. Any measurement carried out subsequently will be able, by virtue of knowledge of the angle at which it is carried out, to be compared to the reference value at the same angle, deduced from the interpolation.

The rotational movement of the wafer is well suited to "in-situ" characterization, i.e. characterization during the deposition of the layers on the wafer.

It is also possible to carry out translational movements of the wafer in its plane so as to carry out a complete characterization of the wafer. Once again, it is enough to know the linear movements of the wafer perfectly, either by direct measurement of the movement, or by prior characterizations. Measurement by linear movements is well suited to the characterization either of virgin wafers, with a view to determining their planarity before deposition, or of finished wafers, with a view to inspecting their surface finish after deposition. One of the main advantages of this technique is that the measurements may be carried out outside of vacuum chambers "ex situ", in an environment that is much less constraining than that of vacuum chambers.

One of the advantages of carrying out measurements continuously is that, even if the image of the pattern is very deformed in the case of substantial deformations of the wafer, it is always possible to follow the evolution of this deformation so that there is never any ambiguity in the measured points.

Figure 4:
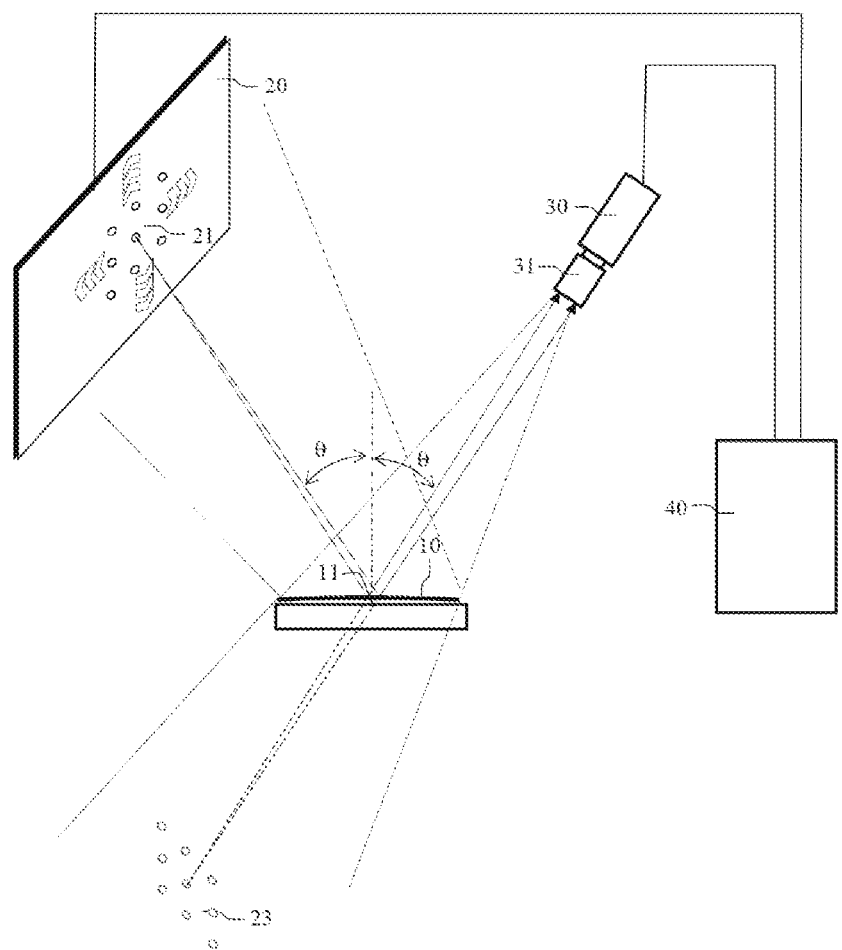
FIG. 4 shows a second embodiment of the measuring device according to the invention, the device comprising a display screen by way of lighting pattern.

By way of second nonlimiting example, FIG. 4 shows a second embodiment of the device according to the invention for measuring deformations of a wafer 10. The same notations have been used in FIG. 4 as were used in FIG. 1. The camera used is of the same nature. In this second embodiment, the wafer 10 remains stationary. To obtain the movement of the measurement regions, the lighting pattern is moved. There are various ways of achieving this movement of the pattern. The simplest and most reproducible way consists in moving the pattern over a display screen. This movement is symbolized by chevrons arranged along two different axes in FIG. 4. Thus, in this configuration, no mechanical part is movable. Moreover, it is easy not only to move the lighting pattern, but it is also possible to duplicate it or to enlarge it or to modify it. It is also easy to perfectly know the positions on the display screen of the spots of light from which the lighting pattern is formed. The brightness and resolution of current-day display screens are sufficient to produce lighting patterns of small size. By way of example, the brightness of the spots is comprised between 200 and 500 $cd/m^2$ and the average revolution of the screen is between 100 and 500 dots per inch (DPI).

Once again, by carrying out a series of measurements, a complete map of the deformations of the wafer is determined.

Figure 5:
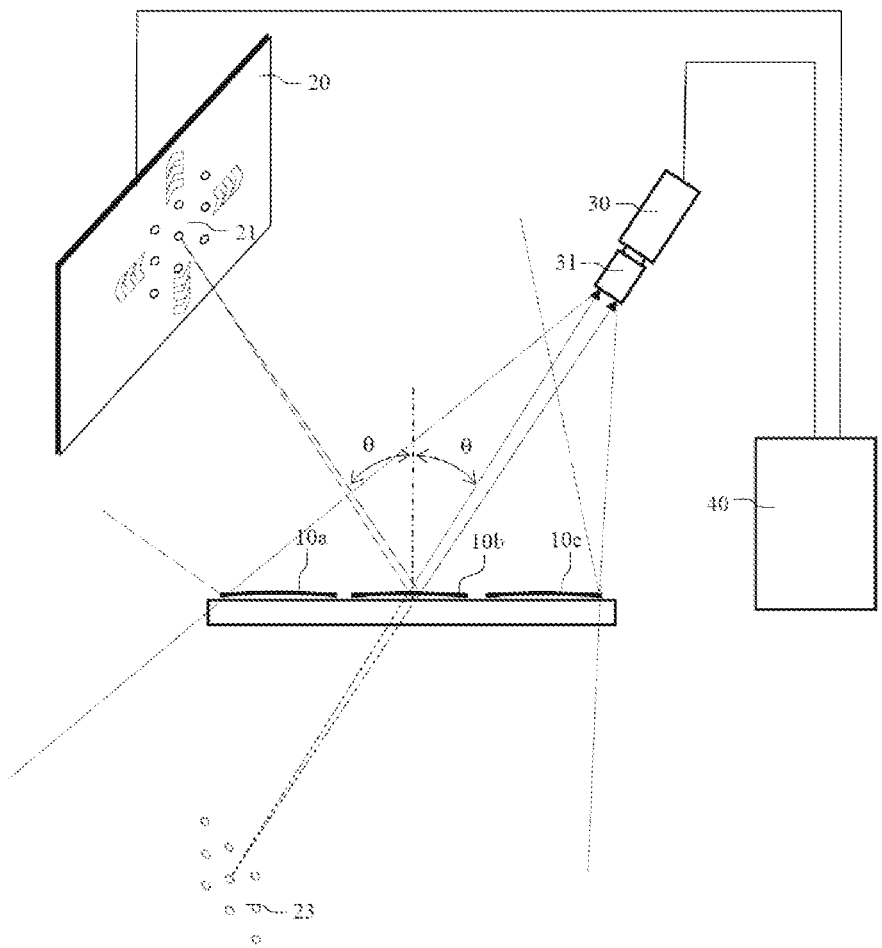
FIG. 5 shows a variant of this second embodiment of the measuring device according to the invention.

In one variant shown in FIG. 5, it is possible to measure a plurality of wafers 10a, 10b and 10c in a given series of measurements, for example to perform an inspection of the reproducibility of deposition operations. This type of inspection is normally carried out ex situ under more favorable environmental conditions.

As may be seen in FIGS. 1, 4 and 5, provided that the angle of incidence θ of the emitted beams preserves a certain value, for example higher than a few degrees, the portion generating the lighting pattern is naturally separate from the receiving camera. The same does not go when this angle of incidence θ is small or zero, i.e. when the measurements are carried out at normal or almost normal incidence on the wafer.

Figure 6:
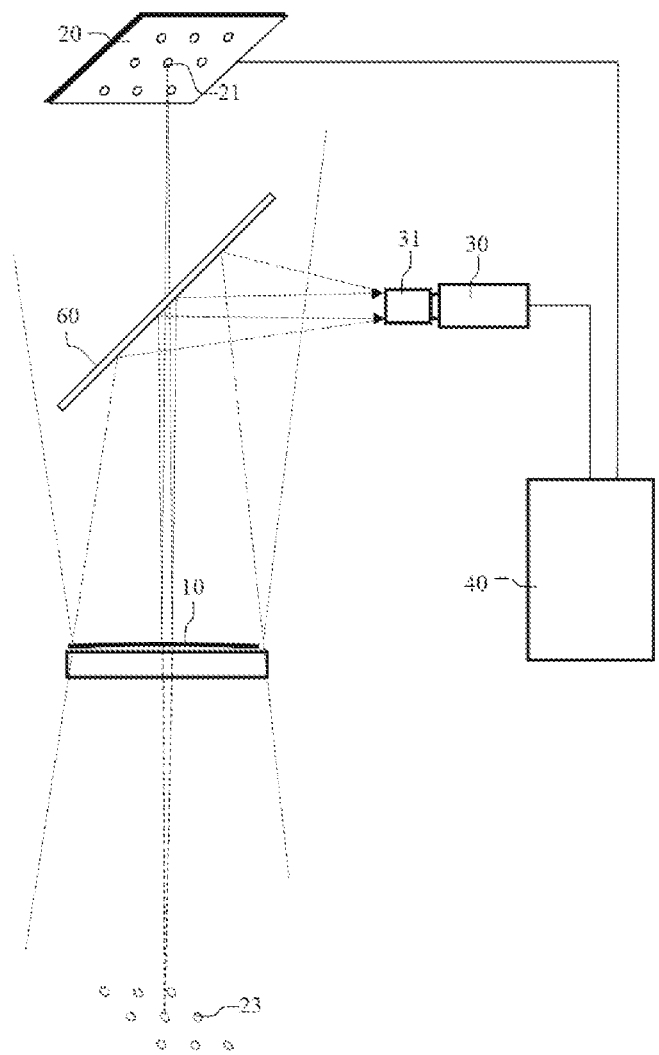
FIGS. 6 and 7 show a third embodiment of the measuring device according to the invention and a variant of said embodiment.
Figure 7:
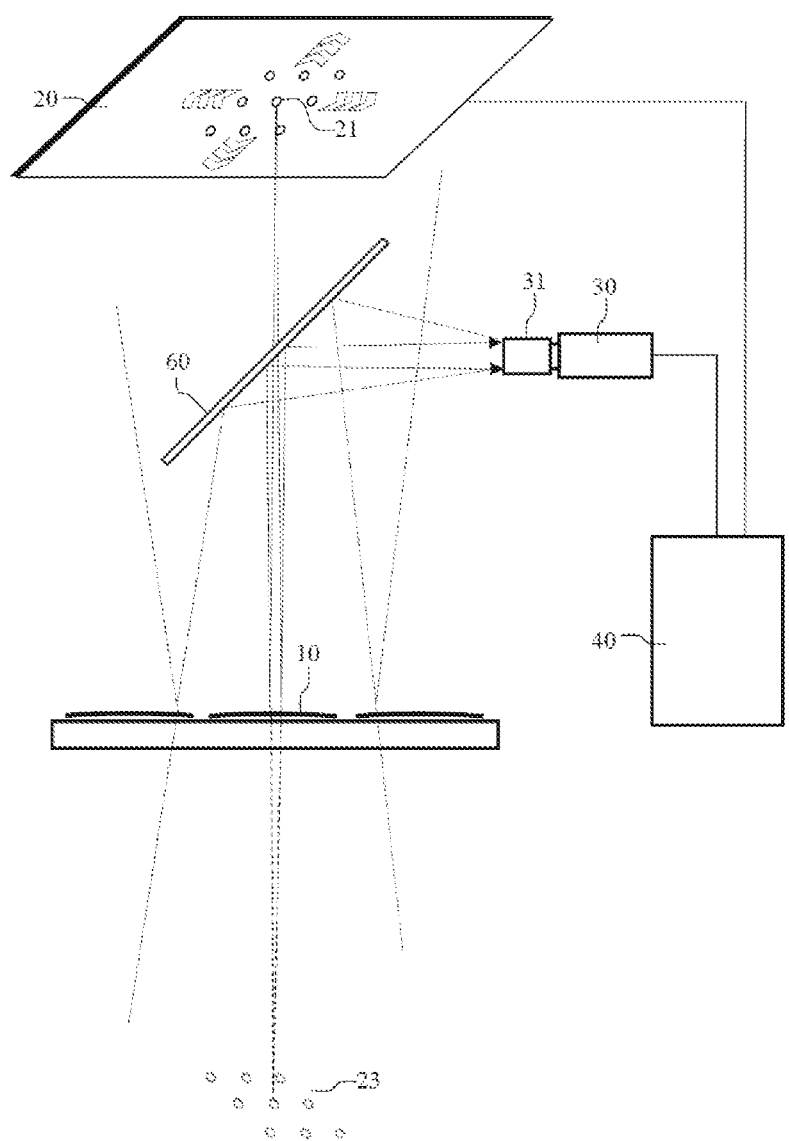

To solve this problem, the measuring device comprises a half-silvered planar beam splitter as may be seen in FIGS. 6 and 7. This splitter 60 is arranged so that the image of the pattern of spots, after transmission by the beam splitter, reflection from the wafer and reflection from said beam splitter forms on the detector of the camera. It is also possible to invert lighting pattern and camera. In this case, the image of the pattern of spots after reflection from said beam splitter, reflection from the wafer and transmission by said beam splitter forms on the detector of the camera.

Of course, it is possible with this setup to obtain movements of the measurement region either via movements of the lighting pattern on a display screen, as shown in FIG. 7, or via movements or rotations of the wafer.

Figure 8:
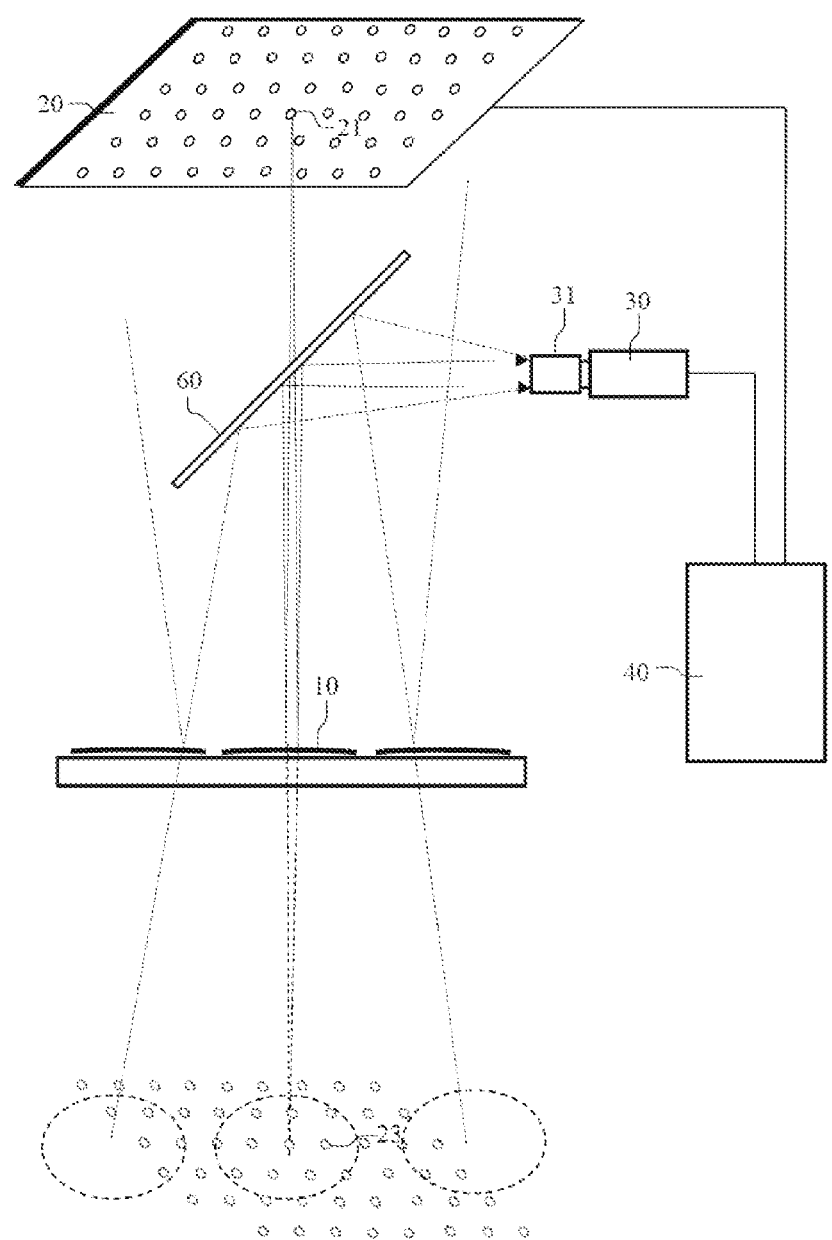
FIG. 8 shows a fourth embodiment.

It is also possible, as indicated in FIG. 8, to simultaneously inspect a plurality of wafers using a lighting device the lighting pattern of which is of large dimensions and contains a high number of lighting spots, and to obtain a map of the instantaneous deformation.

It has been seen that, in the case of planar or weakly curved surfaces, it is possible to increase the sensitivity of the device by increasing the angle of incidence, sensitivity being exacerbated at grazing incidence. There is a second way of increasing the sensitivity of the device, this time when the reflective surface is curved. The measuring device according to the invention allows the curvature of a reflective surface to be measured by observing the deformation of the image of an object via this surface. To this end, the enlargement between the image of the lighting pattern and the lighting pattern itself is measured. For a given deformation of the reflective surface, the larger the variation in enlargement, the higher the sensitivity of the measuring device. It is therefore advantageous to seek configurations allowing the best sensitivity to enlargement to be obtained. These configurations are obtained when the image of the pattern is located in the vicinity of the optic of the camera. This condition can be obtained only for concave reflective surfaces. In this case, if the distance of the pattern to the center of the reflective surface is denoted d, the distance from the lens of the camera to the same center is denoted d', and the radius of the curvature of the surface is denoted R, for the sensitivity to enlargement to be maximum, it is necessary for the distances d and d' to respect the following equation:

$$d \cdot d'/(d+d')=R/2$$

Figure 9:
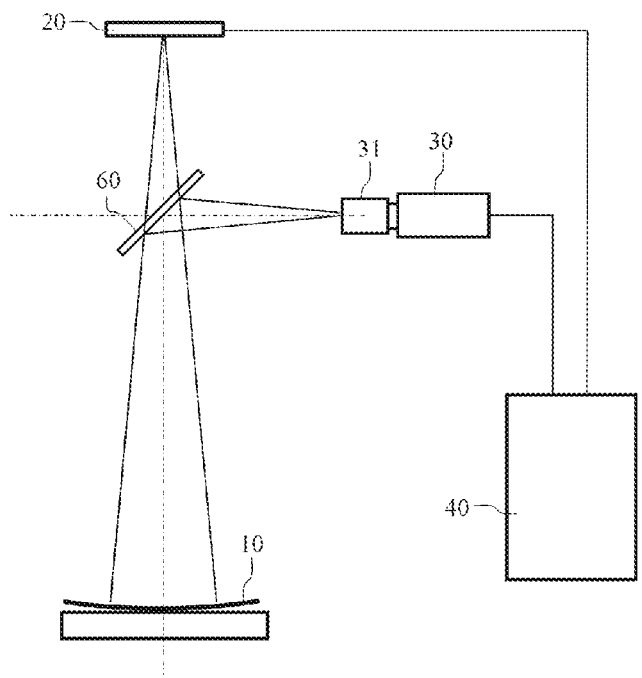
FIG. 9 shows one embodiment of the device according to the invention, suitable for measuring concave reflective surfaces.

A simple configuration that allows this high sensitivity to enlargement to be obtained is that with the lighting pattern placed at the center of curvature of the reflective surface. This arrangement is shown in FIG. 9. In this figure, the references used are identical to those used in the preceding figures. In this case, the distance d is equal to the radius R of the reflective surface 10 and the distance d' is also equal to the same radius R. In order to separate the light rays emitted by the pattern from the rays reflected by the reflective surface 10, a half-silvered mirror 60 is used as in the preceding devices of FIGS. 6, 7 and 8.

Figure 10:
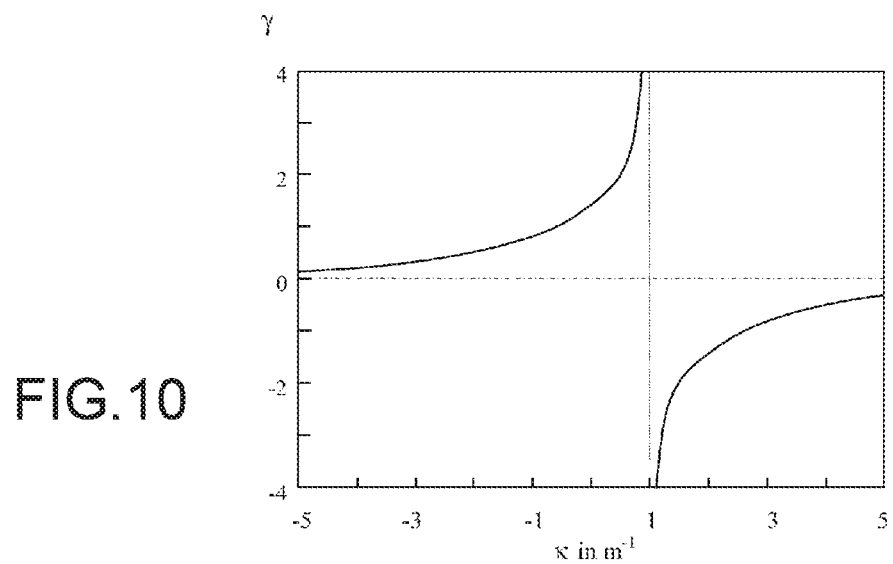
FIG. 10 shows the variations in the enlargement as a function of the radius of curvature of the reflective surface.

The curve of FIG. 10 shows the variations in the enlargement γ as a function of the curvature κ of the surface for distances d and d' equal to one meter. In FIG. 10, the curvature κ varies between −5 and +5 and the enlargement between −4 and +4. When the curvature κ of the surface is equal to one meter, i.e. when its radius of curvature is equal to one meter, the preceding equation is respected and the enlargement γ diverges, as may be seen in FIG. 10. The maximum sensitivity is then obtained. Any variation in the radius of curvature about this value will lead to a very large variation in enlargement.

This last arrangement works only with a concave reflective surface. In the case of semiconductor wafers, it is possible to use a planar wafer that will be prestressed so as to obtain the desired curvature. It is easily possible to obtain this stress by, for example, performing a deposition on the back side, which will curve the wafer. A front-side deposition introducing a small variation in the radius of curvature will lead to a substantial variation in the enlargement seen by the camera.

Generally, the further the luminous object and the camera are from the reflective surface, the better the sensitivity of the measuring device.

The curvature of the reflective surface is not necessarily the same in every direction. This is in particular the case when a crystalline film is deposited on a semiconductor wafer. For example, during crystalline growth of an anisotropic material, an anisotropic deformation is observed, with one direction more curved than another. When the lighting pattern is composed of separate spots of light such as shown in FIGS. 2 to 8, the anisotropy information is obtained simultaneously in two orthogonal directions for each analyzed image. However, a single image is insufficient to determine the axes of anisotropy. It is necessary to perform a complete rotation of the wafer about its axis in order to determine the axes of anisotropy.

Figure 11:
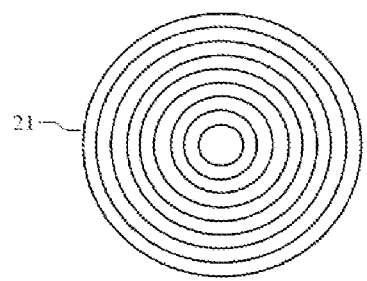
FIGS. 11 and 12 show a lighting pattern containing concentric circles and the image thereof formed by a curved reflective surface.
Figure 12:
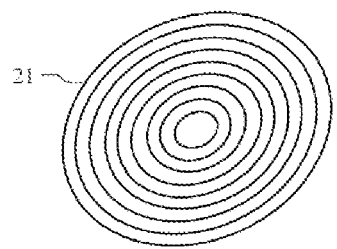

To determine the anisotropy information, it is necessary to use a more suitable lighting pattern than the matrix array of spots of light. Thus, if, by way of pattern, a circle of light or an ellipse of light or even a series of concentric circles or a series of concentric ellipses is used, it is then possible to determine, by means of a single image, all the wafer deformation information. FIG. 11 shows a lighting pattern 21 of this type composed of nine concentric circles of light and FIG. 12 shows the image of these concentric circles after reflection from the reflective wafer. The elliptic deformation of the circles and the inclination of the axes of the ellipses is representative of the anisotropy of the reflective wafer.

There is no particular problem with producing these particular circular or elliptical lighting patterns.

The invention claimed is:

1. A method for measuring the deformation of at least one reflective surface of an object using a measuring device, said measuring device comprising at least one lighting pattern containing spots of light, a camera and an image-analyzing device, the light coming from the spots being reflected by the reflective surface, the reflective surface forming a virtual image of said lighting pattern, said virtual image created by the reflective surface being located behind said reflective surface, the lighting pattern and the camera being arranged so that, in the position of measurement of the deformation of said surface, the virtual image of the lighting pattern formed by reflection of said lighting pattern on the reflective surface is visible to the detector of the camera, said camera being disposed at a position that is symmetric with that of the lighting pattern with respect to the normal to the reflecting surface, said virtual image being representative of the deformation of the region of the surface lit by the lighting pattern, the camera being configured to form a final image of said virtual image of the lighting pattern, on said detector of the camera, wherein the method for carrying out a measurement comprises an analysis step of said final image comprising the following sub-steps:

1. measuring at least one distance between the images of two spots of light of said lighting pattern;
2. determining the ratio between this measured distance and at least one reference distance, said reference distance corresponding to a distance between images of the two spots obtained by reflection on a reference surface;
3. determining, from the ratio, the enlargement in a defined direction; and
4. determining the deformation of the reflective surface in said defined direction, wherein the analysis step comprises a fifth sub-step in which sub-steps 1 to 4 are carried out simultaneously for a plurality of images of spots of light so as to measure the enlargement simultaneously in a plurality of given directions and to determine in real time the anisotropy of the deformation of the reflective surface.

2. The measuring method as claimed in claim 1, wherein the lighting pattern contains a set of discrete spots of light distributed in a matrix array.

3. The measuring method as claimed in claim 1, wherein the lighting pattern contains at least one circle or one ellipse of light, the measurement being carried out on the images of spots belonging to this circle or to this ellipse of light.

4. The measuring method as claimed in claim 1 wherein the method comprises a step of carrying out at least one second measurement, the second measurement comprising emitting a second lighting pattern, so that the first lighting pattern associated with the first measurement lights a first region of the surface different from the second region of the surface lit by the second lighting pattern associated with the second measurement, the camera remaining stationary between the two measurements.

5. A device for measuring the deformation of a least one reflective surface of an object, said measuring device comprising:
- at least one lighting pattern containing spots of light, the light coming from the spots being reflected by the reflective surface, the reflective surface forming a virtual image of said lighting pattern, said virtual image created by the reflective surface being located behind said reflective surface;
- a camera; and
- an image-analyzing device,
- the lighting pattern and the camera being arranged so that, in the position of measurement of the deformation of said surface, the virtual image of the lighting pattern formed by reflection of said lighting pattern on the reflective surface is visible to the detector of the camera, said camera being disposed at a position that is symmetric with that of the lighting pattern with respect to the normal to the reflecting surface, said virtual image being representative of the deformation of the region of the surface lit by the lighting pattern, the camera being configured to form a final image of said virtual image of the lighting pattern, on said detector of the camera,
- wherein the image-analyzing device comprises a processing unit configured to perform an analysis step of said final image comprising the following sub-steps:
  1. measure at least one distance between the images of two spots of light;
  2. determine the ratio between this measured distance and at least one reference distance, said reference distance corresponding to a distance between images of the two spots obtained by reflection on a reference surface;
  3. determine, from this ratio, the enlargement in a defined direction;
  4. determine the deformation of the reflective surface in said defined direction,
- wherein the analysis step comprises a fifth sub-step in which sub-steps 1 to 4 are carried out simultaneously for a plurality of images of spots of light so as to measure the enlargement simultaneously in a plurality of given directions and to determine in real time the anisotropy of the deformation of the reflective surface.

6. The measuring device as claimed in claim 5, wherein the device is configured for carrying out at least two measurements, each measurement comprising emitting a lighting pattern, being arranged so that the first lighting pattern associated with the first measurement lights a first region of the surface different from the second region of the surface lit by the second lighting pattern associated with the second measurement, the camera remaining stationary between the two measurements.

7. The measuring device as claimed in claim 5, wherein the measuring device is configured for moving, deforming or magnifying the lighting pattern.

8. The measuring device as claimed in claim 5, wherein the device is configured for carrying out at least two measurements by moving the object in a defined plane between the two measurements and measuring said movement.

9. The measuring device as claimed in claim 8, wherein the object is moved in said plane by rotating or translating devices.

10. The measuring device as claimed in claim 5, wherein the measuring device comprises a display screen and graphical means for generating said lighting pattern on said display screen.

11. The measuring device as claimed in claim 10, wherein the lighting pattern is a matrix array of discrete spots of light.

12. The measuring device as claimed in claim 10, wherein the lighting pattern is a circle of light or an ellipse of light or a series of circles of light or ellipses of light.

13. The measuring device as claimed in claim 5, wherein the measuring device comprises a lighting source that lights an opaque screen containing apertures arranged so as to form a lighting pattern.

14. The measuring device as claimed in claim 5, wherein the measuring device comprises a half-silvered planar beam splitter arranged so that the image of the pattern of spots, after transmission by said beam splitter, reflection from the surface and reflection from said beam splitter forms on the detector of the camera or after reflection from said beam splitter, reflection from the surface and transmission by said beam splitter forms on the detector of the camera.

15. The measuring device as claimed in claim 5, wherein the measuring device comprises means for carrying out a plurality of measurements to produce a complete map of the deformation of said surface.

16. The measuring device as claimed in claim 5, wherein the local, concave or convex, radius of curvature of the deformations varies between a few millimeters and a few tens of kilometers.

17. The measuring device as claimed in claim 5, wherein the object is a semiconductor wafer, the reflective surface being one of the sides of said wafer.

18. The use of a measuring device as claimed in claim 5, to measure a concave reflective surface, wherein the lighting pattern and the camera are arranged so that the image of the lighting pattern reflected by the concave reflective surface is located in the vicinity of the lens of the camera.

19. The use of a measuring device as claimed in claim 5, to monitor a process leading to a deformation of the reflective surface of an object in a growth reactor, wherein the measurements are carried out during the deposition of at least one layer of material on said reflective surface.

20. The use of a measuring device as claimed in claim 5, in a device for inspecting semiconductor wafers, wherein the measurements are carried out continuously on at least two different objects.

* * * * *